(12) United States Patent
Nanevicz

(10) Patent No.: US 7,973,682 B2
(45) Date of Patent: *Jul. 5, 2011

(54) CONFIGURATIONS FOR DATA PORTS AT DIGITAL INTERFACE FOR MULTIPLE DATA CONVERTERS

(75) Inventor: Michael V Nanevicz, Palo Alto, CA (US)

(73) Assignee: Samplify Systems, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/649,952

(22) Filed: Dec. 30, 2009

(65) Prior Publication Data

US 2010/0103011 A1    Apr. 29, 2010

Related U.S. Application Data

(63) Continuation of application No. 12/120,988, filed on May 15, 2008, now Pat. No. 7,642,939.

(51) Int. Cl.
 *H03M 9/00* (2006.01)
(52) U.S. Cl. ........................................ 341/101; 341/155
(58) Field of Classification Search .......... 341/100–155
 See application file for complete search history.

(56) References Cited

U.S. PATENT DOCUMENTS

| | | | |
|---|---|---|---|
| 5,061,926 A * | 10/1991 | Washiyama | 341/122 |
| 6,700,403 B1 | 3/2004 | Dillon | |
| 6,707,411 B1 | 3/2004 | Poulton et al. | |
| 7,126,521 B2 | 10/2006 | Barcelona | |
| 7,336,729 B2 * | 2/2008 | Agazzi | 341/118 |
| 7,369,078 B2 * | 5/2008 | Nickel et al. | 341/155 |
| 7,498,965 B2 * | 3/2009 | Jarman et al. | 341/155 |
| 7,642,939 B2 * | 1/2010 | Nanevicz | 341/101 |

FOREIGN PATENT DOCUMENTS

| | | |
|---|---|---|
| KR | 1020010078552 | 8/2001 |
| KR | 1020020012571 | 2/2002 |
| KR | 1020020013934 | 2/2002 |
| KR | 1020030012158 | 2/2003 |

OTHER PUBLICATIONS

Search Report mailed Dec. 29, 2009 in PCT/US2009/043715, 12 pages.
JEDEC Standard for Serial Interface for Data Converters JESD204, JEDEC Solid State Technology Association Apr. 2006, 42 pages.
LVDS Owner's Manual Including High-Speed CML and Signal Conditioning, 4th Edition, Jan. 2008, National Semiconductor, 116 pages.
LVDS Owner's Manual, Low-Voltage Differential Signaling, 3rd Edition, Spring 2004, National Semiconductor, 94 pages.

* cited by examiner

*Primary Examiner* — Lam T Mai
(74) *Attorney, Agent, or Firm* — Haynes Beffel & Wolfeld LLP; Carolyn Koenig

(57) ABSTRACT

A data converter includes N analog-to-digital converters (ADCs) to sample multiple analog signals in response to an input clock to produce N signal samples per sample period. For each sample period, the bits of the N signal samples are multiplexed to M sets of multiplexed bits where 1<M<N. There are K bits in each multiplexed data set, where K equals the number of bits per sample multiplied by N then divided by M. A data clock is provided having a data clock frequency that substantially equals the input clock frequency multiplied by K. The M sets of multiplexed bits are serialized and provided to M data ports at the data clock frequency for transfer across the digital interface. This abstract does not limit the scope of the invention as described in the claims.

10 Claims, 14 Drawing Sheets

| Mode | ADC Clock Frequency | Data Clock Frequency Factor | Number Active Data Ports | Figure |
| --- | --- | --- | --- | --- |
| Normal | up to 65 MHz | 12x | 16 | 1A, B |
| Port. Conc. - 0 | 33.3 - 50 MHz | 16x | 12 | 2A, B |
| Port. Conc. - 1 | 25 - 33.3 MHz | 24x | 8 | 3A, B |
| Port. Conc. - 2 | 16.6 - 25 MHz | 32x | 6 | 4A, B |
| Port. Conc. - 3 | up to 16.6 MHz | 48x | 4 | 5A, B |
| Serial | up to 4.0 MHz | 192x | 1 | --- |

CONFIGURATIONS FOR DATA PORTS AT DIGITAL INTERFACE FOR MULTIPLE DATA CONVERTERS

RELATED APPLICATIONS

This application is a continuation of U.S. patent application Ser. No. 12/120,988 filed on 15 May 2008.

BACKGROUND OF THE INVENTION

The present invention relates to configurations for transferring signal samples over data ports at the digital interface for multiple analog-to-digital converters (ADCs), particularly for transferring sampled signal data at higher rates over fewer data ports at the digital interface.

A typical digital interface for multiple ADCs operating in parallel includes the same number of data ports for transferring signal samples. Each ADC digitally samples a corresponding input analog signal at a sample rate and a number of bits per sample, or sample width, to produce the signal samples. The bit rate is the product of the sample rate and the number of bits per sample. In typical designs, the data transfer rate of the data port is the same as the ADC bit rate. In flexible ADC systems, the ADC can be configured to operate at a selected sample rate within a range of possible sample rates, often in response to an externally supplied sample clock. The data ports can also operate at different data transfer rates so that they match the ADC bit rates. The bits of the signal samples are serialized and transmitted over the data port at the same rate that they are generated but with a fixed latency.

In general, the sample rate of the ADC is set to at least the Nyquist rate for the input analog signal to produce samples free of aliasing. The Nyquist rate is two times the bandwidth of the input analog signal. In some situations, an input analog signal having a narrower bandwidth can allow the sample rate of the ADC to be lower than the ADC's maximum sample rate. The data port connected to the ADC will transfer the bits at a lower rate than the maximum data transfer rate. Even though they are operating below capacity, the data ports often consume the same amount of power. Furthermore, the number of I/O pins remains the same so that the design complexity and related system costs are the same as when the bandwidth is fully utilized or when the ADCs are operating at their maximum rate.

An analogous situation exists for DAC interfaces. For example, signal samples representing multiple signals that have been processed by a digital signal processor are transferred across a digital interface to multiple DACs where they will be converted to multiple analog signals. The digital interface includes a data port for each DAC. When the product of the sample rate and number bits per sample results in a lower bit rate than the maximum data transfer rate per port, there is excess data transfer bandwidth at the digital interface. Again, there are power consumption, design complexity and system costs related to maintaining the same number of data ports having unused bandwidth.

Another approach for transferring data from multiple ADCs or to multiple DACs is to serialize the signal samples for a high speed serial data link. Existing industry standards such as PCI Express, aimed at microprocessors or interface devices, add overhead and complexity to the serialized data that are unnecessary for a simple continuous, constant bandwidth data stream. The industry standard entitled "JEDEC Standard for Serial Interface for Data Converters JESD204," published by the JEDEC Solid State Technology Association in April 2006, specifies architectures and data formats for transfer of signal samples over high speed serial data links between data converters and digital logic devices, referred to as 8b/10b SerDes. The JEDEC Standard describes arranging the bits of signal samples into 8-bit data words. Each 8-bit data word is mapped to a 10-bit symbol in accordance with an 8b/10b code (IEEE Standard 802.3-2002). The 10-bit symbols are then serialized for transfer over the data link. For signal samples having a data width greater than 8 bits, the bits are sequentially arranged into 8-bit data words. For instance, a 12-bit signal sample would have 8 bits in a first word and 4 bits in a second word. The next 12-bit signal sample would have 4 bits in the second word and 8 bits in a third word and so forth. For multiple ADCs or DACs in parallel, the bits of signal samples corresponding to each ADC or DAC are arranged sequentially in a frame of 8-bit data words, where a frame includes the data words generated during one sample period. The 8b/10b encoding of each 8-bit word forms a frame of 10-bit symbols that are serialized and transferred over the data link. On the receiver side, the received serial data stream is deserialized to reconstruct the 10-bit symbols that are 8b/10b decoded to regenerate the 8-bit words of each frame. The bits corresponding to the sample width of each signal sample are extracted from the 8-bit words to reconstruct the signal samples for the corresponding ADC or DAC. The JEDEC Standard specifies a range of gross data transfer rates from 0.3125 to 3.125 gigabits per second (Gbps).

The JEDEC SerDes architecture has the complexity and overhead of 8b/10b encoding at the transmit side and 8b/10b decoding at the receive side. The fixed 8-bit word size also adds complexity for data converters whose sample width is not equal to 8 bits and/or have multiple ADCs or multiple DACs operating in parallel. The JEDEC SerDes architecture is applicable to high speed serial data links for longer distances (up to 20 cm at 3.125 Gbps), however it is more costly and requires more power.

In a system having multiple ADCs or multiple DACs, there is a need for a digital interface that increases power efficiency, reduces system complexity and reduces the cost of the system. There is a need for a digital interface that exploits unused bandwidth of the data ports to realize these improvements.

SUMMARY OF THE INVENTION

Embodiments of the present invention have been made in consideration of the foregoing conventional problems. An object of the present invention is to use fewer ports for data transfer at a digital interface of a data converter having multiple ADCs or multiple DACs.

To realize the foregoing object, one aspect of the present invention provides a method for transferring signal samples over a digital interface of a data converter implemented in a single integrated circuit including N ADCs, N analog inputs at an analog interface for receiving N analog signals, where N is greater than one, and at least one data port at the digital interface. The method comprises:

digitally sampling the N analog signals received at the analog interface of the integrated circuit, wherein the N ADCs respond to an input clock to form N signal samples per sample period, the input clock having an input clock frequency, wherein each ADC produces one signal sample per sample period in accordance with the input clock frequency, the signal sample represented by a number of bits per sample;

mapping the bits of the N signal samples for each sample period to M subsets of bits to form M multiplexed data sets, where M is greater than one and less than N, wherein each multiplexed data set consists of a number K of multiplexed bits equal to the number of bits per sample multiplied by N then divided by M;

generating a data clock having a data clock frequency substantially equal to the input clock frequency multiplied by the number K;

serializing the multiplexed bits of the M multiplexed data sets in response to the data clock to provide the K multiplexed bits of a corresponding multiplexed data set sequentially at the data clock frequency to a corresponding data port of the plurality of data ports; and transmitting the M multiplexed data sets in parallel over M of the data ports of the integrated circuit, wherein the corresponding data port transmits the K multiplexed bits of the corresponding multiplexed data set at a data transfer rate that depends on the data clock frequency.

Another aspect of the present invention that realizes the foregoing object provides a multiple analog to digital converter apparatus implemented in a single integrated circuit including N analog inputs that receive N analog signals at an analog interface, where N is greater than one, and at least one data port at a digital interface. The apparatus comprises:

N ADCs that digitally sample the N analog signals received at the analog interface of the integrated circuit, wherein the N ADCs produce N signal samples per sample period in response to an input clock, the input clock having an input clock frequency, wherein each ADC produces one signal sample per sample period in accordance with the input clock frequency, the signal sample represented by a number of bits per sample;

one or more multiplexers, each multiplexer receiving signal samples from at least two ADCs and each ADC providing signal samples to one of the multiplexers, wherein the one or more multiplexers map the bits of the N signal samples for each sample period to M subsets of bits to form M multiplexed data sets in accordance with a predetermined mapping, where M is greater than one and less than N, wherein each multiplexed data set consists of a number K of multiplexed bits equal to the number of bits per sample multiplied by N then divided by M;

a data clock having a data clock frequency substantially equal to the input clock frequency multiplied by the number K, the data clock distributed to a plurality of serializers; and the plurality of serializers receiving the M multiplexed data sets from the one or more multiplexers and providing the M multiplexed data sets to M of the data ports, wherein a corresponding serializer receives a corresponding multiplexed data set and responds to the data clock to provide the K multiplexed bits sequentially at the data clock frequency to a corresponding data port, the corresponding data port transmitting the K multiplexed bits of the corresponding multiplexed data set at a data transfer rate that depends on the data clock frequency, wherein the M data ports transmit the multiplexed data sets in parallel from the integrated circuit.

Another aspect of the present invention that realizes the foregoing object provides a multiple analog to digital converter apparatus implemented in a single integrated circuit including N analog inputs that receive N analog signals at an analog interface, where N is greater than one, and at least one data port at a digital interface. The apparatus comprises:

N ADCs operating in parallel to digitally sample the N analog signals received at the analog interface of the integrated circuit to form N signal samples per sample period, wherein each ADC operates at a sample rate to produce one signal sample per sample period, the signal sample represented by a number of bits per sample such that the ADC produces bits at an ADC bit rate;

one or more multiplexers, each multiplexer receiving signal samples from at least two ADCs and each ADC providing signal samples to one of the multiplexers, wherein the multiplexer maps the bits of the N signal samples for each sample period to M subsets of bits to form M multiplexed data sets in accordance with a predetermined mapping, where M is greater than one and less than N, wherein each multiplexed data set includes a number of multiplexed bits equal to the number of bits per sample multiplied by N then divided by M; and M serializers, wherein each serializer receives a corresponding multiplexed data set and provides the multiplexed bits sequentially to a corresponding data port, the corresponding data port transmitting the multiplexed data set provided by the serializer at a data transfer rate that is greater than the ADC bit rate, wherein the M of the data ports transmit the M multiplexed data sets in parallel from the integrated circuit.

Another object of the present invention is to use fewer data ports for data transfer between a source device providing multiple digital signals and a data converter having multiple DACs. To realize the foregoing object, one aspect of the present invention provides a method of transferring N digital signals from a source device to a data converter, wherein each digital signal is represented by a plurality of signal samples having a sample rate and a number of bits per sample, the source device having at least one output data port, the data converter implemented in a single integrated circuit including N DACs, at least one input data port at a digital interface and N analog outputs at an analog interface. The method comprises:

mapping the bits representing the N signal samples for each sample period to M subsets of bits in accordance with a predetermined mapping to form M multiplexed data sets at the source device, where M is greater than one and less than N, wherein each multiplexed data set includes a number of multiplexed bits equal to the number of bits per sample multiplied by N then divided by M;

transmitting the M multiplexed data sets in parallel over M of the output data ports of the source device, wherein each output data port transmits a corresponding multiplexed data set at a data transfer rate that is greater than the sample rate multiplied by the number of bits per sample;

receiving the M multiplexed data sets over M of the input data ports at the digital interface of the integrated circuit, wherein each input data port receives a corresponding multiplexed data set at the data transfer rate;

reordering the M multiplexed data sets to reproduce a set of the N signal samples in parallel, wherein the N signal samples are produced during each sample period, wherein the reordering is an inverse mapping of the predetermined mapping at the source device;

providing consecutive sets of N signal samples corresponding to consecutive signal samples of the N digital signals to the N DACs, each DAC receiving the consecutive signal samples of a corresponding digital signal;

converting the consecutive signal samples of the N digital signals to N analog signals, each DAC converting the consecutive signal samples to a corresponding analog signal at the sample rate; and providing the N analog signals to the N analog outputs at the analog interface of the integrated circuit.

BRIEF DESCRIPTIONS OF THE DRAWINGS

FIG. 6B shows a table of operating modes for the configurable system of FIG. 6A.

DETAILED DESCRIPTION

Figure 1A:
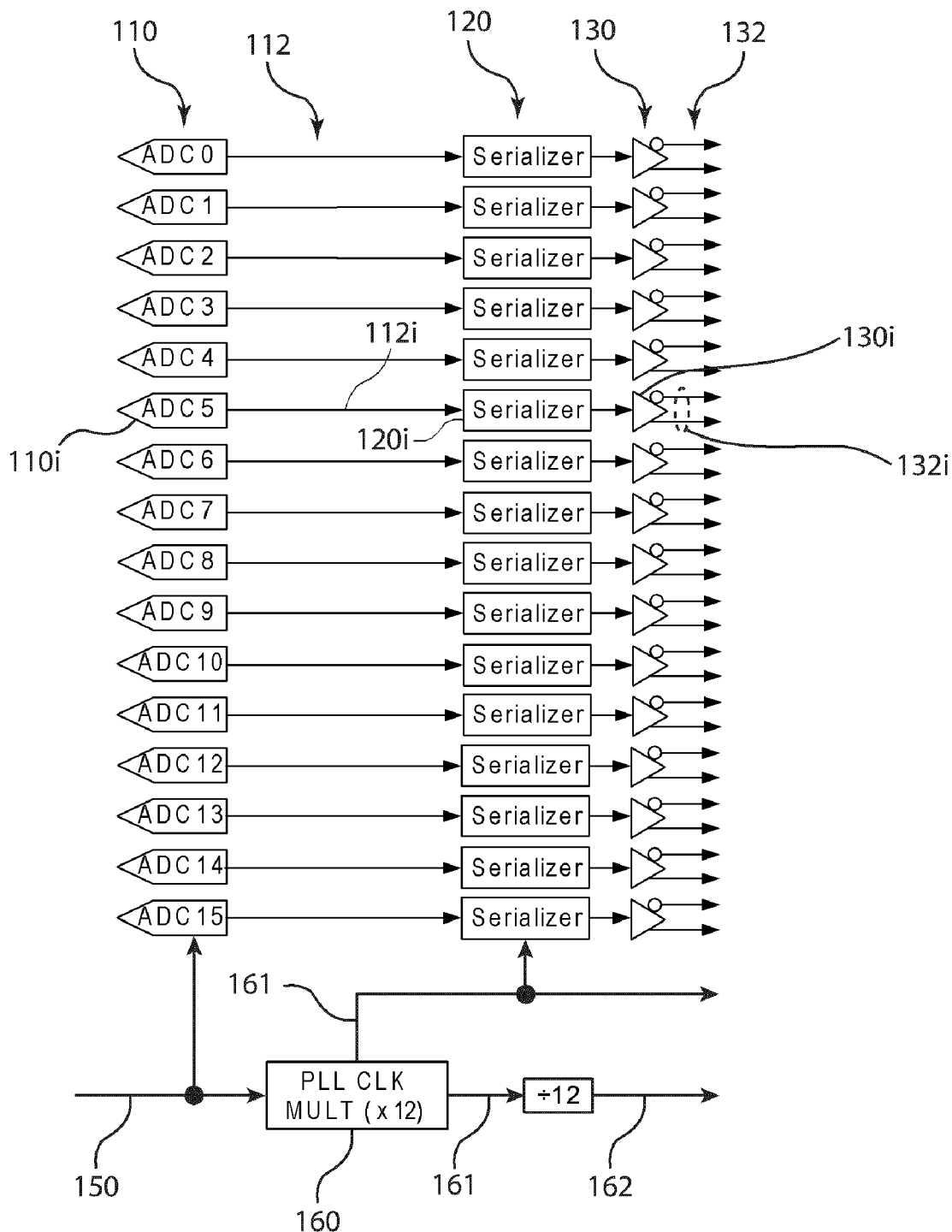
FIG. 1A is a block diagram of a parallel ADC system, in accordance with the prior art.

FIG. 1A is a block diagram of a parallel ADC system in accordance with the prior art. This system includes sixteen channels for digitizing sixteen analog signals, each channel including an ADC 110i and a data port 130i. The number of channels can be different depending on the signal processing application. The ADCs 110 digitally sample a plurality of input analog signals (not shown) in parallel to produce a plurality of signal samples at the ADC outputs 112 during each sample period. Each ADC 110i samples the corresponding input analog signal at the sample rate. The sample period is the inverse of the sample rate. The signal sample at each ADC output 112i has a sample width of twelve bits per sample. The plurality of serializers 120 arranges the bits of each signal sample in sequential order, where the most significant bit (MSB) is first or the least significant bit (LSB) is first in accordance with user control (not shown). Each serializer 120i provides its sequence of bits to a corresponding data port 130i. The data ports 130 produce outputs 132 for transfer across I/O pins (not shown). For this example, the data ports 130 are low voltage differential signaling (LVDS) ports, described further below. The ADC input clock 150 provided by a host system has a clock frequency corresponding to the sample rate. The ADCs 110 respond to the ADC input clock 150 to sample the input analog signals at the sample rate. The phase lock loop (PLL) 160 operates on the ADC input clock to produce a data clock 161 for the serializers 120 and the data ports 130. The data clock frequency corresponds to the data transfer rate of the bits output from each serializer 120i. The data clock frequency is the ADC clock frequency multiplied by the number of bits per sample, in this case twelve, so the data transfer rate is the same as the ADC bit rate. The data clock frequency is divided by twelve to provide a frame clock 162. The frame clock 162 indicates the timing of output data frames, where one frame includes a data word for each channel. In this case, the data word includes the serialized bits representing one signal sample. Input data ports at a host device receive the frames of bits using a corresponding number of LVDS ports operating in parallel and reproduce each signal sample, as described below with respect to FIG. 7.

The data ports 130 provide low voltage differential signaling (LVDS) data transmission. The document entitled "LVDS Owner's Manual Including High-Speed CML and Signal Conditioning", Fourth Edition, published in January 2008 by National Semiconductor describes LVDS devices and architectures. The LVDS data transmission has desirable characteristics, including a maximum data transfer rate of 3.125 Gbps, low noise and low power consumption. The differential signaling requires two I/O pins per channel output 132i, one for the positive differential output and one for the negative differential output, referred to as an LVDS pair. At the host device, the input data ports are LVDS receivers. The LVDS receiver responds to the received differential signal to generate logic states corresponding to the bits of the signal samples.

Figure 1B:
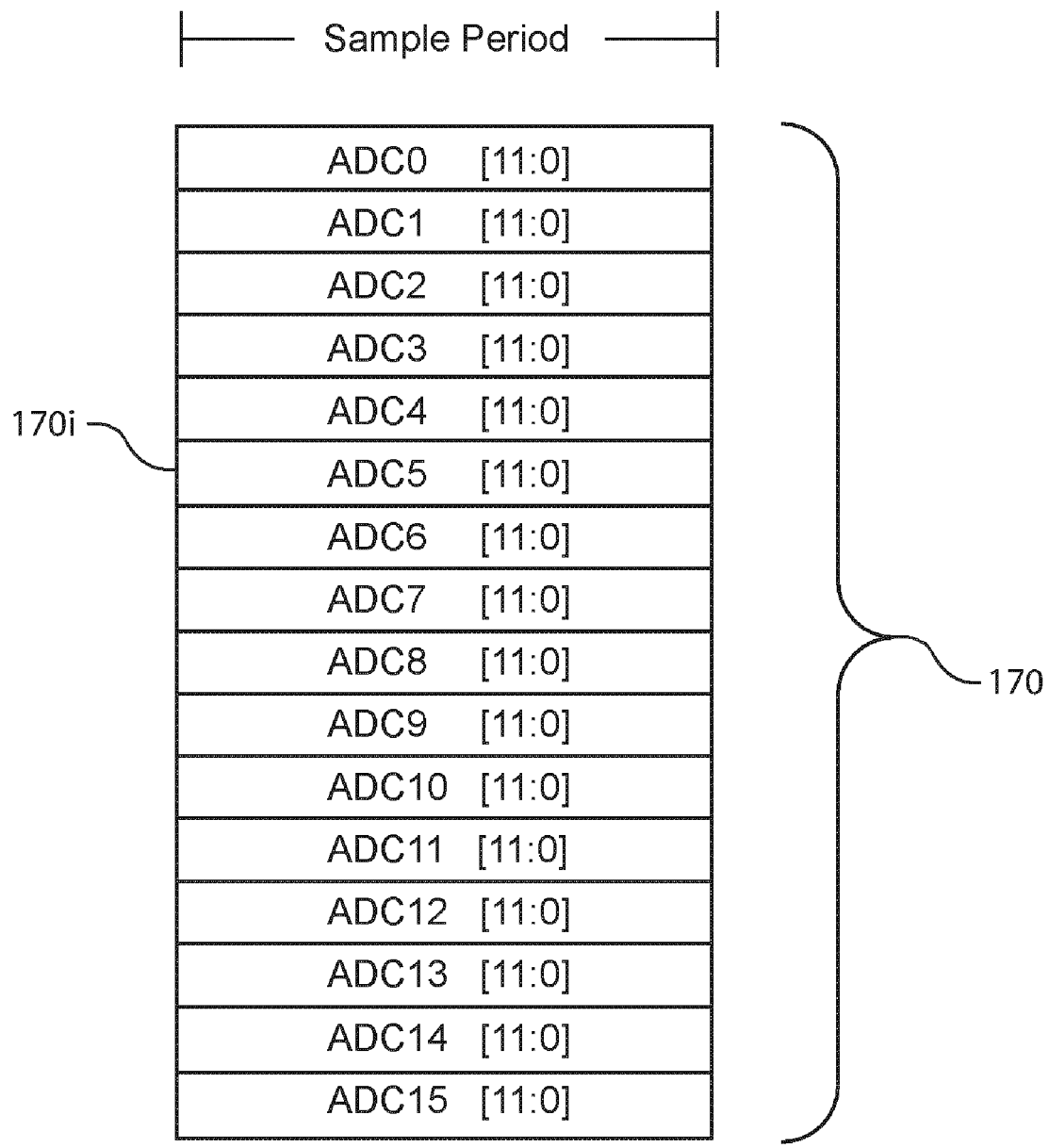
FIG. 1B illustrates the arrangement of the output bits during one sample period for the system of FIG. 1A, in accordance with the prior art.

FIG. 1B illustrates the arrangement of the output bits during one sample period for the system of FIG. 1A. The table 170 represents the sequence of bits output from the sixteen data channels during one sample period. Line 170i represents the twelve serialized bits of a sample generated by the $i^{th}$ ADC 110i that form the input to the $i^{th}$ data port 130i. For example ADC5[11:0] represents the serialized 12 bits of the sample output from ADC 110i (ADC5) during one sample period. Since the data transfer rate is 12 times the sample rate, the transfer period per bit is the sample period divided by 12.

The data ports 130i will have excess bandwidth when the product of the sample rate and number of bits per sample results in an ADC bit rate that is lower than the maximum data transfer rate. For example in FIG. 1A, suppose the ADC clock frequency is 50 megahertz (MHz), corresponding to 50 megasamples/second (Msps), and the sample width is 12 bits per sample so that each ADC 110i produces 600 megabits per second (Mbps). The data transfer rate will be 600 Mbps for each data port 130i. For an LVDS port having a maximum data transfer rate of 800 Mbps, there is an unused bandwidth of 200 Mbps for each port. The LVDS ports 130 will consume the same amount of power to transfer data at 600 Mbps as they would for transferring data at full capacity of 800 Mbps.

Figure 2A:
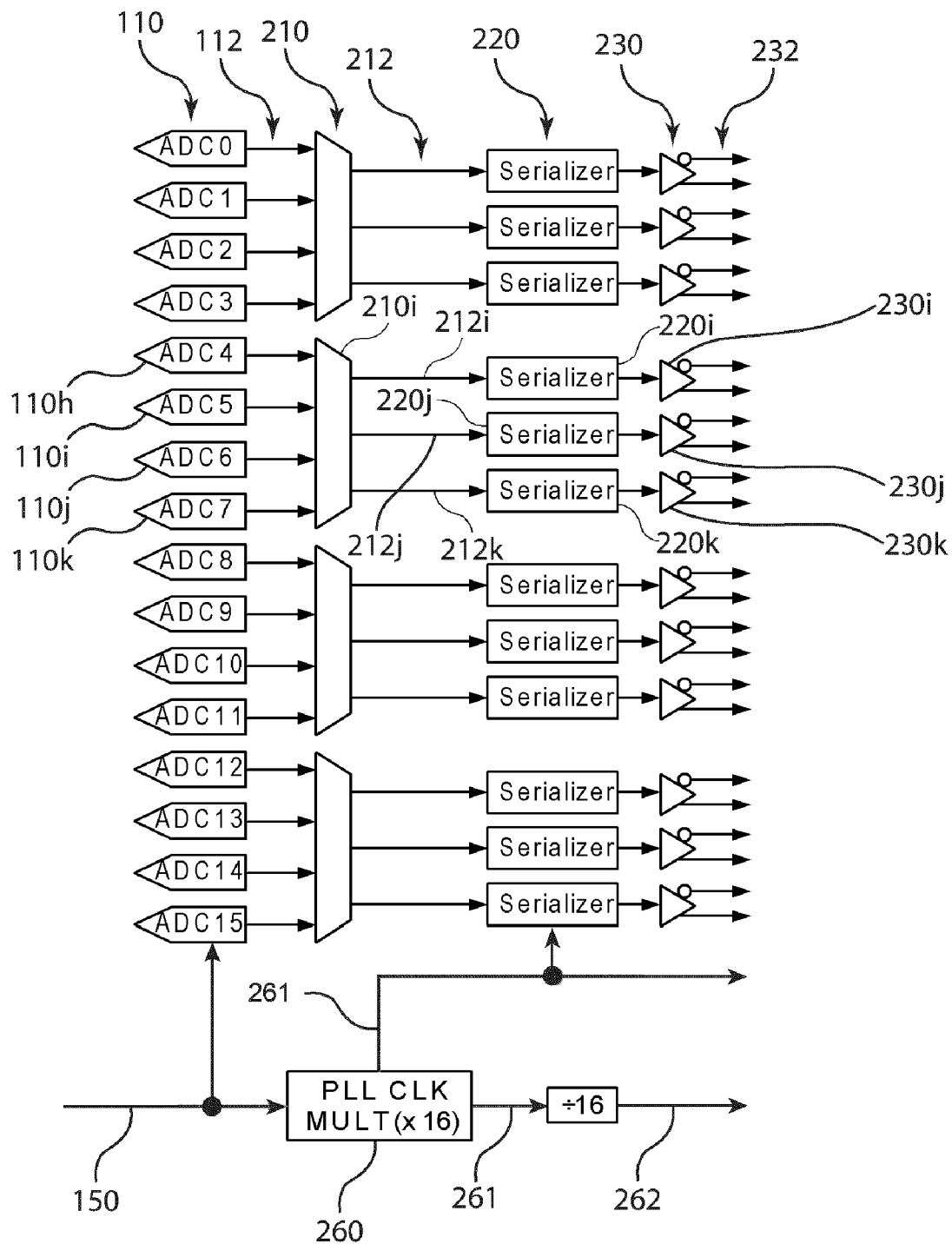
FIG. 2A is a block diagram of a data converter system configuration that includes twelve data ports for transferring data from sixteen ADCs.

The present invention exploits this excess data transfer capacity by combining bits from multiple ADC outputs and transmitting the combined data at a faster rate over fewer ports. Each data port transmits the combined data at a rate that is greater than the ADC bit rate and up to the maximum data transfer rate. For the above example, the signal samples output from the sixteen ADCs 110 at an ADC bit rate of 600 Mbps can be combined into twelve bit streams, each with a bit rate of 800 Mbps. Twelve of the sixteen ports would transfer the twelve combined bit streams, each at the maximum data transfer rate of 800 Mbps (800 Mbps×12=600 Mbps×16). Depending on the sample rate, the number of bits per sample and the maximum data transfer rate, several configurations are possible. FIGS. 2A,B to 5A,B show alternative configurations for systems having sixteen ADCs, twelve bits per sample and 800 Mbps maximum data transfer rate for each port. FIGS. 2A,B apply to sample rates up to 50 MHz, FIGS. 3A,B apply to sample rates up to 33 MHz, FIGS. 4A,B apply to sample rates up to 25 MHz and FIGS. 5A,B apply to sample rates up to 16.6 MHz. These system configurations are exemplary and do not limit the scope of the present invention as described in the claims. The present invention also applies to configurations having different numbers of ADCs, sample widths and maximum data transfer rates.

FIG. 2A is a block diagram of a system configuration that includes twelve data ports for transferring data from sixteen ADCs. This configuration can accommodate sample rates up to 50 Msps corresponding to ADC clock frequencies up to 50 MHz. The multiplexers 210 receive the signal samples output from the ADCs 110. Four ADCs 110h, 110i, 110j and 110k provide signal samples to one multiplexer 210i. The multiplexer 210i includes three outputs 212i, 212j and 212k. The multiplexer 210i reorders the 48 bits of the samples it receives during each sample period and distributes the reordered bits to three serializers 220i, 220j and 220k. Each serializer 220i, 220j and 220k receives a subset of the 48 reordered bits, in this case 16 bits, and serializes them for transfer by a corresponding port 230i, 230j and 230k. The PLL 260 produces the data clock 261 having a frequency that is 16 times the ADC clock frequency. The frame clock 262 corresponds to frames having 16-bit data words. The twelve ports 230 transfer the serialized bits at a data transfer rate that is 16 times the sample rate. In contrast, the system of FIG. 1A includes 16 data ports 130 to transfer the serialized bits at a data transfer rate that is 12 times the sample rate and frames having 12-bit data words.

Figure 2B:
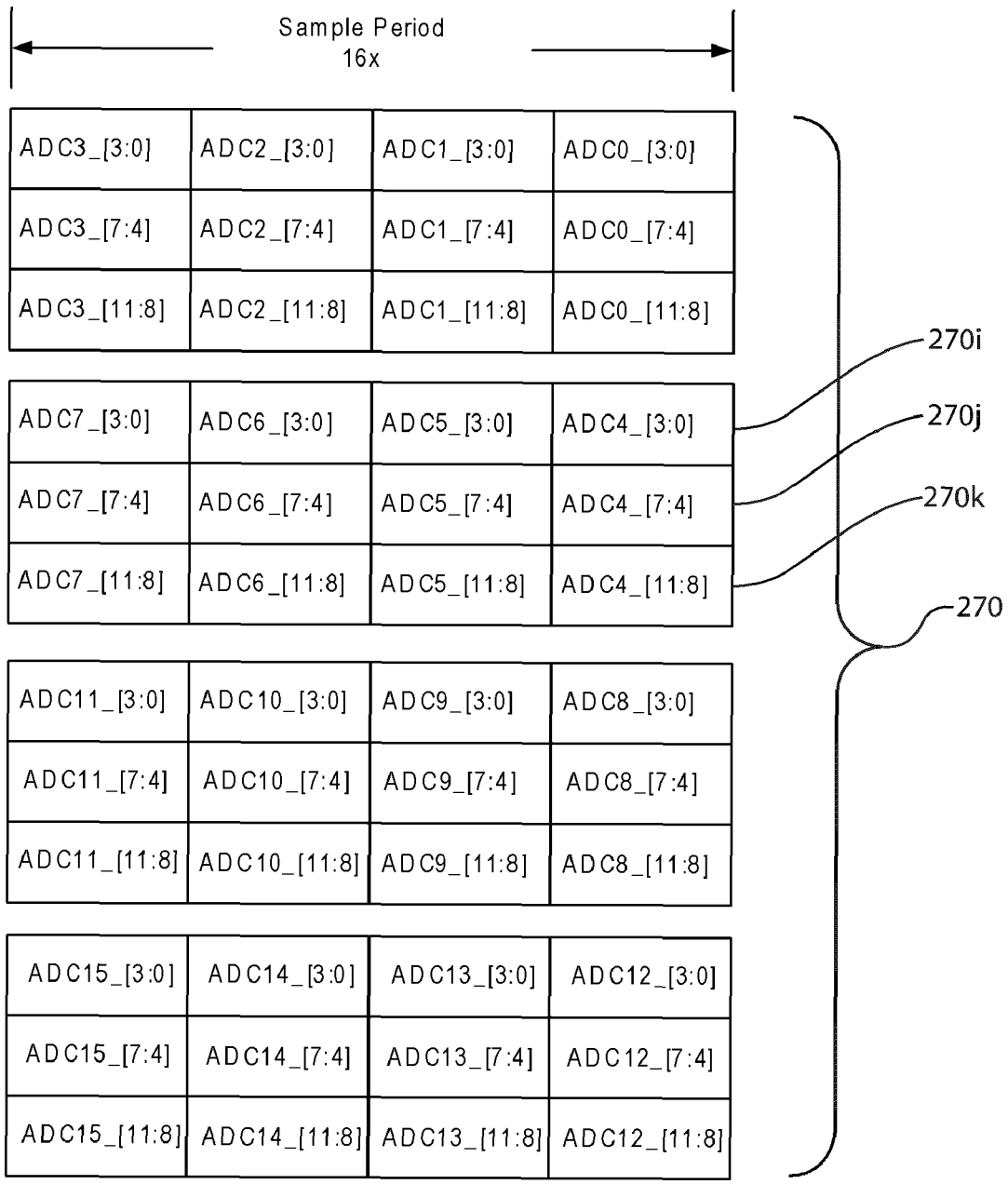
FIG. 2B illustrates the arrangement of bits provided to the data ports during one sample period for the embodiment of FIG. 2A.

FIG. 2B illustrates the arrangement of bits provided to the data ports 230 during one sample period for the embodiment of FIG. 2A. Table 270 depicts the bit mapping of the sample bits output from the sixteen ADCs during one sample period. For the configuration having four multiplexers 210 and three serializers 220, the multiplexers 210 group the bits of each signal sample into blocks of 4 bits. The multiplexer 210i directs the first block of bits to the serializer 220i, the second block of bits to the serializer 220j and the third block of bits to the serializer 220k. Lines 270i, 270j and 270k represent the bit mapping for serializers 220i, 220j and 220k, respectively. Other bit mappings resulting in different bit orders can be used provided that each of the serializers 220 outputs sixteen mapped bits during one sample period. The host device reorders the received multiplexed bits in accordance with the inverse bit mapping to restore the original signal samples.

Figure 3A:
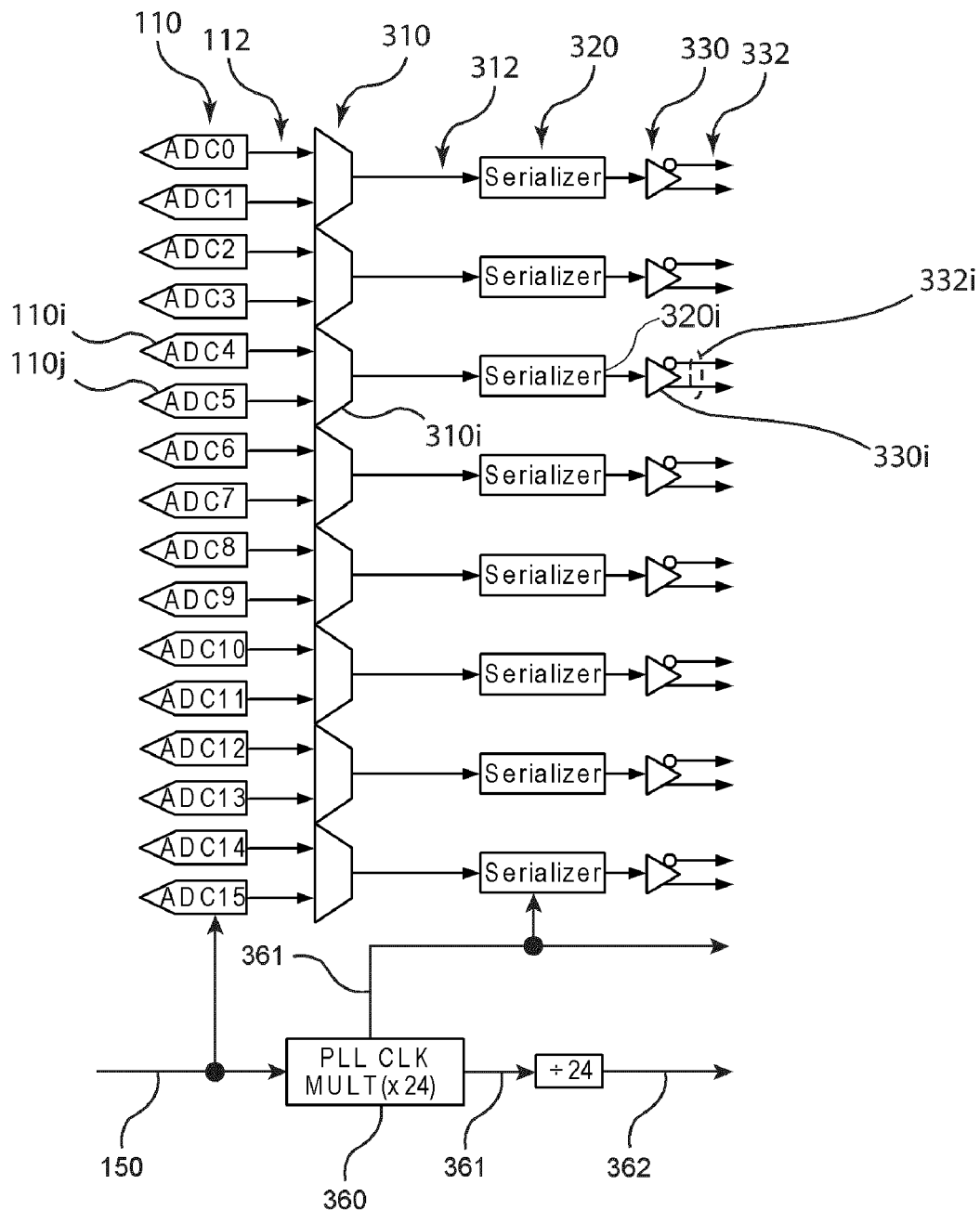
FIG. 3A is a block diagram of a data converter system configuration that includes eight data ports for transferring data from sixteen ADCs.

FIG. 3A is a block diagram of a system configuration that includes eight data ports for transferring data from sixteen ADCs. This configuration can accommodate sample rates up to 33.3 Msps corresponding to ADC clock frequencies up to 33.3 MHz. For sample rates in this range, the bits of the signal samples from the ADCs 110 can be multiplexed to form eight bit streams. The multiplexers 310 provide bit streams to eight serializers 320 for transfer over eight data ports 330. During one sample period, the multiplexer 310i receives two signal samples in parallel from ADCs 110i and 110j and provides a single stream of 24 consecutive bits to the serializer 320i. The serializer 320i provides the multiplexed bits to the data port 330i. The PLL 360 produces the data clock 361 having a frequency that is 24 times the ADC clock frequency. The frame clock 362 corresponds to frames having 24-bit data words. The data ports 330 respond to the data clock 361 to transfer the serialized bits at a data transfer rate that is 24 times the sample rate. When the sample rate is 33 MHz, the data transfer rate is 792 Mbps.

Figure 3B:
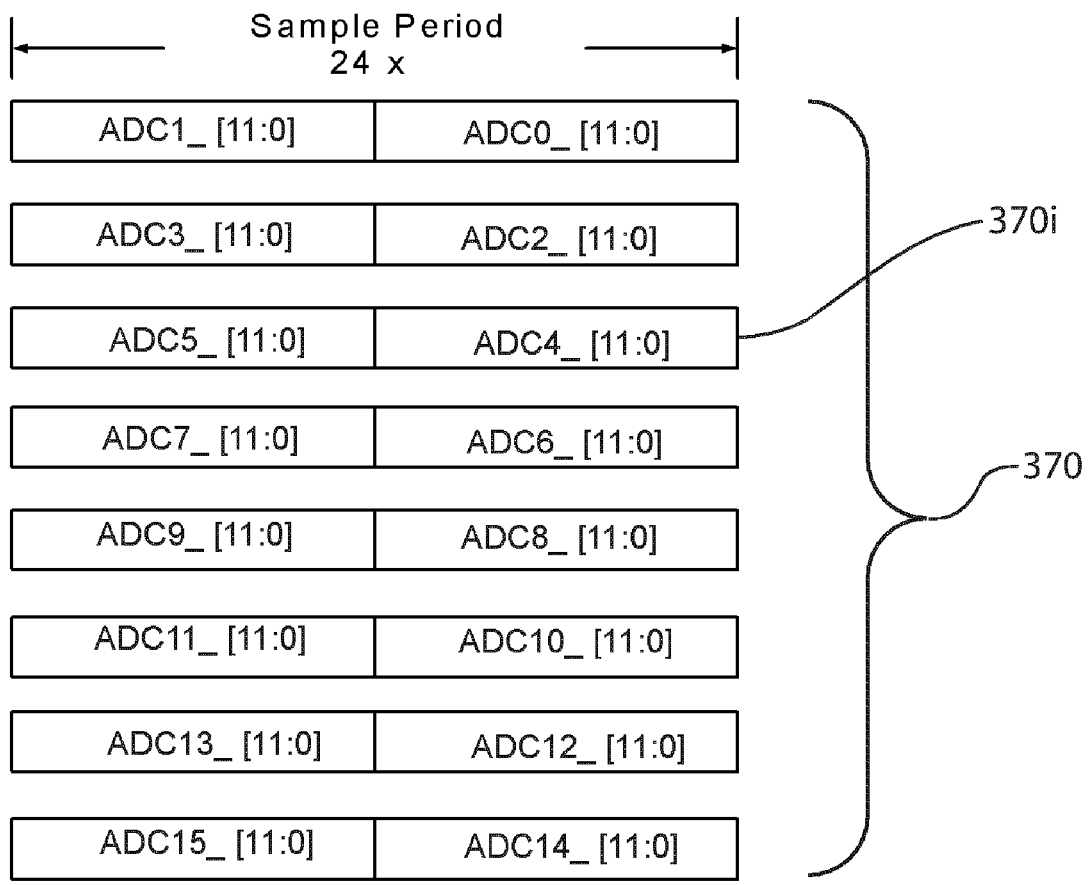
FIG. 3B illustrates the arrangement of bits provided to the data ports during one sample period for the configuration of FIG. 3A.

FIG. 3B illustrates the arrangement of bits provided to the data ports 330 during one sample period for the configuration of FIG. 3A. Table 370 depicts the bit mapping of the sample bits output from the sixteen ADCs during one sample period. The multiplexer 310i provides 24 bits including the twelve bits of the signal sample from ADC 110i followed by the twelve bits of the signal sample from ADC 110j, as shown in line 370i. Again, other bit mappings are possible as long as the multiplexer 310i provides 24 bits during one sample period.

Figure 4A:
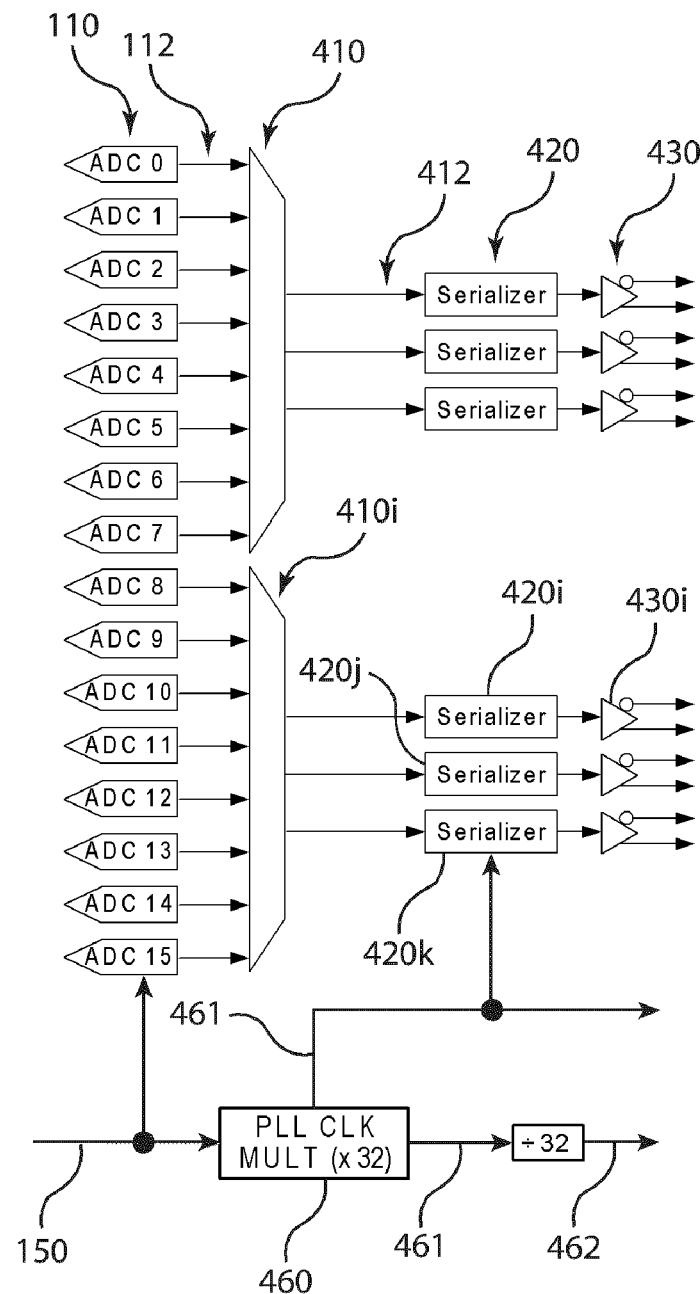
FIG. 4A is a block diagram of a data converter system configuration that includes six data ports for transferring data from sixteen ADCs.

FIG. 4A is a block diagram of a system configuration that includes six data ports for transferring data from sixteen ADCs. This configuration can accommodate sample rates up to 25 Msps corresponding to ADC clock frequencies up to 25 MHz. For sample rates in this range, the bits of the signal samples from the ADCs 110 can be multiplexed into six bit streams. The multiplexers 410 provide bit streams to six serializers 420 for transfer over six data ports 430. During one sample period, each multiplexer 410i combines bits from eight signal samples to form three streams, each with 32 multiplexed bits. Each serializer 420i provides multiplexed bits to the corresponding data port 430i. The PLL 460 produces the data clock 461 having a frequency that is 32 times the ADC clock frequency. The frame clock 462 corresponds to frames having 32-bit data words. The data ports 430 transfer the serialized bits at a data transfer rate that is 32 times the sample rate. For a sample rate of 25 MHz, the data transfer rate is 800 Mbps.

Figure 4B:
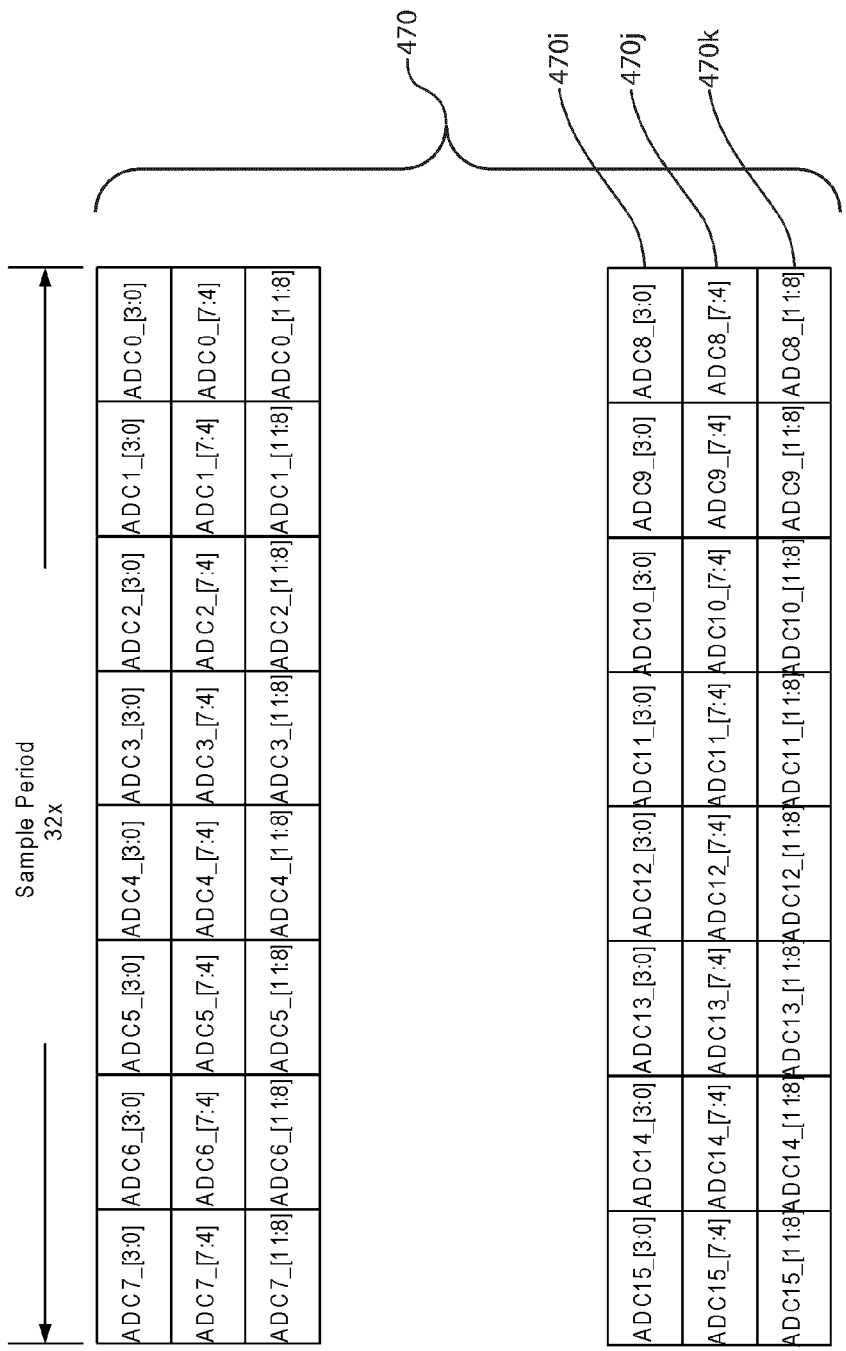
FIG. 4B illustrates the arrangement of bits provided to the data ports during one sample period for the embodiment of FIG. 4A.

FIG. 4B illustrates the arrangement of bits provided to the data ports 430 during one sample period for the embodiment of FIG. 4A. Table 470 depicts the bit mapping of the signal samples output from the ADCs 110 during one sample period. For the configuration having two multiplexers 410 and six serializers 420, each multiplexer 410 groups the bits of each signal sample into blocks of 4 bits. The multiplexer 410i directs the first block of bits to the serializer 420i, the second block of bits to the serializer 420j and the third block of bits to the serializer 420k. Lines 470i, 470j and 470k represent the bit orders for serializers 420i, 420j and 420k, respectively. Again, other bit mappings are possible.

Figure 5A:
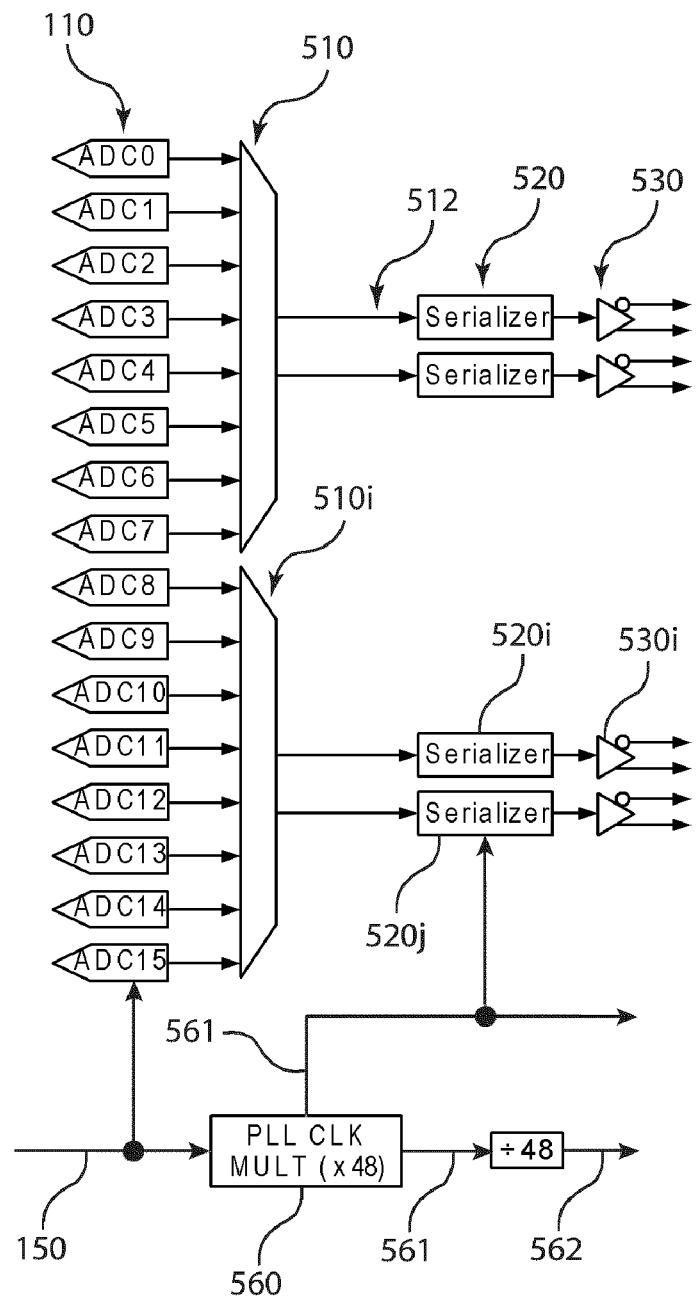
FIG. 5A is a block diagram of a data converter system configuration that includes four data ports for transferring data from sixteen ADCs.

FIG. 5A is a block diagram of a system configuration that includes four data ports for transferring data from sixteen ADCs. This configuration can accommodate sample rates up to 16.6 Msps corresponding to ADC clock frequencies up to 16.6 MHz. For sample rates in this range, the bits of the signal samples from the ADCs 110 can be multiplexed into four bit streams. Two multiplexers 510 provide bit streams to four serializers 520 for transfer over four data ports 530. During one sample period, each multiplexer 510i combines bits from eight signal samples to form two streams, each having 48 multiplexed bits. Each serializer 520i provides the multiplexed bit stream to the corresponding data port 530i. The PLL 560 produces the data clock 561 having a frequency that is 48 times the ADC clock frequency. The frame clock 562 corresponds to frames having 48-bit data words. The data ports 530 each transfer the serialized bits at a data transfer rate that is 48 times the sample rate.

Figure 5B:
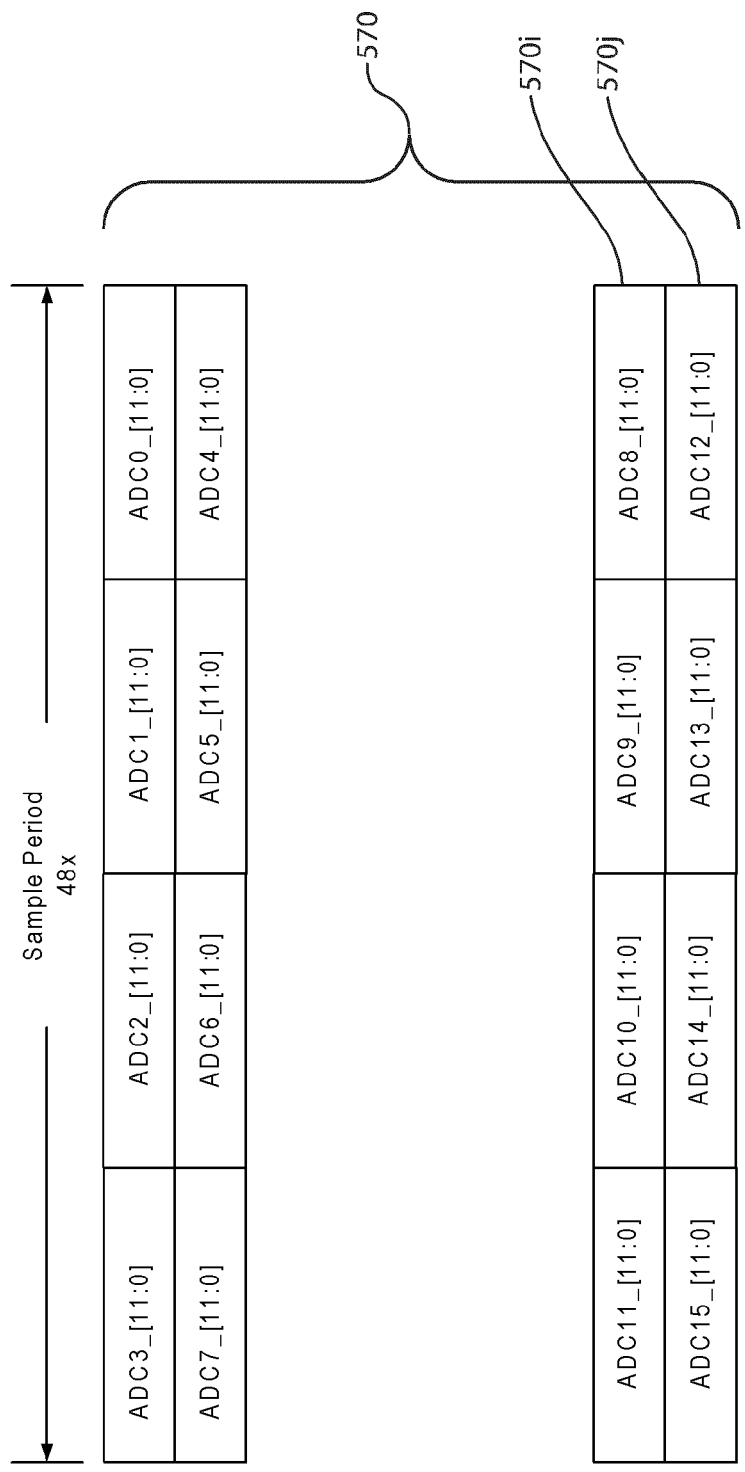
FIG. 5B illustrates the arrangement of bits during one sample period for the embodiment of FIG. 5A.

FIG. 5B illustrates the arrangement of bits during one sample period for the embodiment of FIG. 5A. Table 570 depicts the bit mapping of signal samples output from the sixteen ADCs 110 during one sample period. For the configuration having two multiplexers 510 and four serializers 520, each multiplexer 510i arranges the bits from eight signal samples as shown in lines 570i and 570j. The multiplexer 510i directs the stream of bits shown in line 570i to the serializer 520i and the stream of bits shown in line 570j to the serializer 520j. Again, other bit mappings are possible.

Figure 6A:
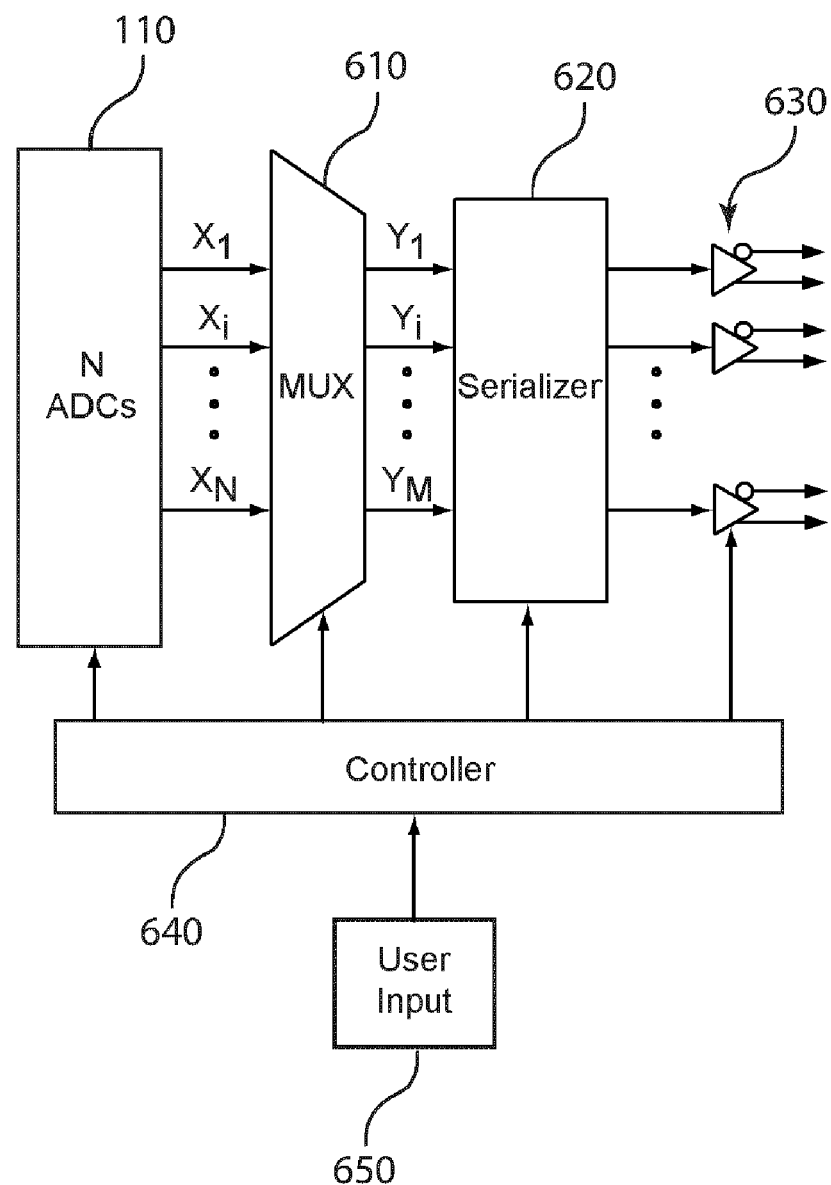
FIG. 6A is a block diagram of a reconfigurable data conversion system.

FIG. 6A is a block diagram of a reconfigurable data conversion system. This system is adaptable to operate in modes associated with the configurations of FIGS. 1A,B to FIGS. 5A,B. The N ADCs 110 digitally sample N input analog signals (not shown) to produce signal samples represented by $x_1$ to $x_N$. The reconfigurable multiplexer 610 reorders the bits of the signal samples $x_1$ to $x_N$ into M multiplexed bit streams $y_1$ to $y_M$. The reconfigurable serializer 620 serializes each multiplexed bit stream $y_j$. The controller 640 enables M of the data ports 630 to transmit the multiplexed bit streams. The controller 640 responds to user input 650 to provide control parameters appropriate for the operating mode. These modes are referred to herein as a normal mode (M=N), one or more port concentration modes (1<M<N) and a serial mode (M=1). The configurable data conversion system includes the ADC input clock, data clock, frame clock and PLL operating as previously described with respect to FIGS. 1A to 5A, but not shown in FIG. 6A. The controller 640 provides control parameters to set the frequencies for the clocks in accordance with the selected operating mode. In this description for the configurable system of FIG. 6A, it is assumed that the system has sixteen ADCs 110 providing 12 bits per sample, sixteen data ports 630 and a maximum data transfer rate of 800 Mbps. This example does not limit the scope of the present invention as described in the claims.

The normal mode corresponds to FIGS. 1A and 1B. The normal mode enables conventional operation, where the N data ports 630 transfer the signal samples at the ADC bit rate. The number of active data ports M equals the number of available data ports N. The controller 640 enables direct connections from the ADCs 110 to the serializers 620, so that the ADCs 110 provide the signal samples directly to the serializers 620. The controller 640 enables N active data ports 630. The normal mode can be used for any sample rate supported by the ADCs 110 and the data ports 630, but is necessary when the ADC bit rate that is at or near the maximum data transfer rate. For example, a sample rate of 65 MHz results in an ADC bit rate of 780 Mbps. This ADC bit rate is sufficiently near the maximum data transfer rate of 800 Mbps that all sixteen of the data ports 630 are used for data transfer.

The port concentration modes correspond to configurations that use M of the N data ports 630, where 1<M<N. The operations of the port concentration modes correspond to FIGS. 2A,B to FIGS. 5A,B. The user can specify control parameters indicating the particular port concentration mode, the ADC clock rate, the data clock rate and the disabled LVDS ports. The controller 640 applies the control parameters to adapt the ADCs 110, multiplexer 610, serializer 620 and data ports 630 to operate in accordance with user's specifications. The controller 640 enables active data ports and powers down the unused ports. For example to configure the system to operate as shown in FIG. 2A having a sample rate of 50 MHz, the controller 640 configures the multiplexer 610 and the serializer 620 to generate 12 multiplexed bit streams (M=12) for the 12 active data ports while the remaining four data ports are powered down. The frequency of sample clock 150 (not shown in FIG. 6A) is set to 50 MHz. The ADCs 110 respond to the sample clock to sample the input analog signals at 50 Msps. The reconfigurable multiplexer 610 and the serializer 620 respond to the control parameters to reorder the bits of the signal samples as described with respect to FIG. 2B and provide twelve multiplexed bit streams corresponding to the twelve active data ports. The controller also provides timing control parameters to a PLL (not shown in FIG. 6) so that the data clock frequency and frame clock frequency are appropriate for the operating mode, which for this example corresponds to PLL 260 in FIG. 2A. At a host device, the transmitted bit streams are received by twelve data ports and are demultiplexed to reproduce the sixteen signal samples for each sample period.

FIG. 6B shows a table of operating modes for the configurable system of FIG. 6A. The configurable system in this example includes five operating modes. The normal mode, corresponding to FIGS. 1A and 1B, is selectable for ADC frequencies from 10 to 65 MHz, the data clock frequency is 12 times the ADC clock frequency and the number of active data ports is 16. Note that for ADC clock frequencies below 50 MHz, the normal mode is less efficient than the port concentration modes because it uses more active data ports. For each port concentration mode, the corresponding range of the ADC clock frequencies allows the most efficient configuration using the fewest number of active data ports. Any port concentration mode can be applied to ADC clock frequencies that are less than lower boundary of the range indicated, however more than the necessary number of data ports will be active. The data clock frequency factor is multiplied by the ADC clock frequency to give the data clock frequency corresponding to the data transfer rate. The values given in FIG. 6B correspond to the example of a system including sixteen ADCs, sample rates up to 65 Msps with twelve bits per sample and maximum data transfer rate of 800 Mbps. Other applications having different system parameters can have different configurations for the operating modes.

For sufficiently low sample rates, the configurable system of FIG. 6A can operate in the serial mode (M=1). In the serial mode, the multiplexer 610 combines the bits of all the signal samples output during each sample period to produce a single multiplexed bit stream. The controller 640 enables one active data port and powers down the remaining unused ports. For example, when the system of FIG. 6A has a sample rate of 4 MHz, the controller 640 configures the multiplexer 610 and the serializer 620 to serialize the bits of the N signal samples during each sample period to generate one serialized data set. The one active data port transmits the serial data sets as a single serial data stream at a data transfer rate of 768 bps, or 192 times the sample rate. In general, a configurable system can operate in the serial mode when the product of the sample rate, sample width and the number of ADCs is less than or equal to the maximum data transfer rate of one data port.

Figure 7:
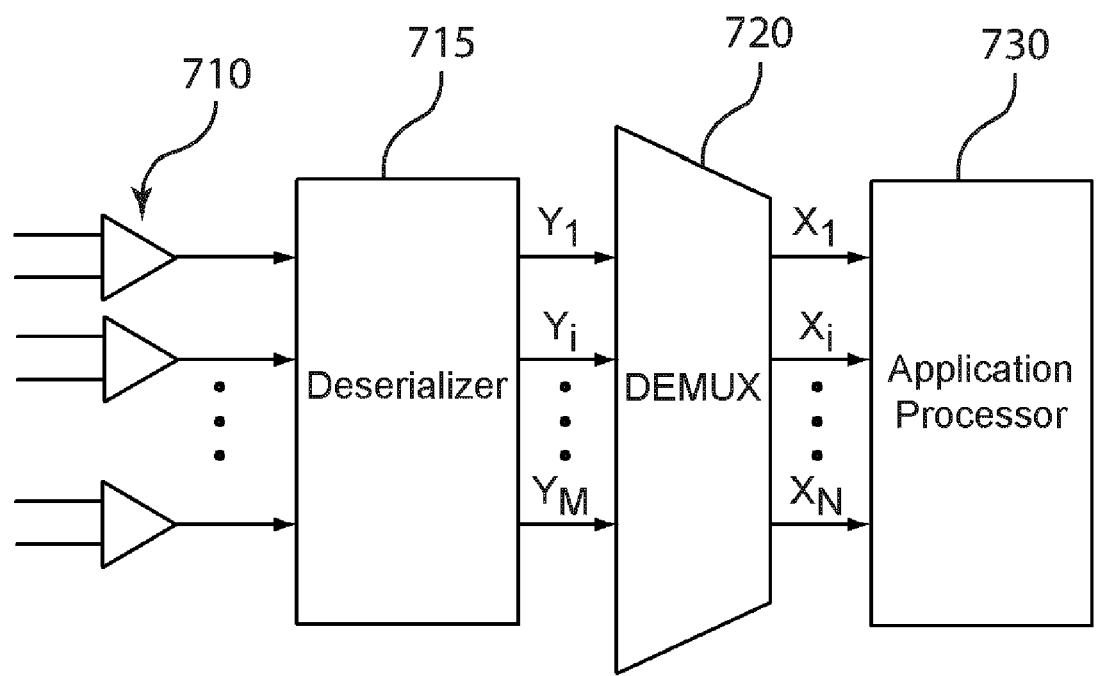
FIG. 7 is a block diagram of the host device that is the destination of the transmitted bit streams.

FIG. 7 is a block diagram of the host device that is the destination of the transmitted bit streams. When the data conversion system transmits the bit streams in a port concentration mode, the host device requires fewer input data ports 710, resulting in power savings and reduced complexity. The input data ports 710 are LVDS receivers. Each LVDS receiver receives the differential signal produced by LVDS transmission and generates a logic state that reproduces the corresponding bits. The deserializer 715 converts the received serial bits to parallel multiplexed bit streams $y_1$ to $y_M$. A demultiplexer 720 rearranges the bits of the received multiplexed bit streams $y_1$ to $y_M$ to the order of the original signal samples $x_1$ to $x_N$. The application processor 730 stores or processes the signal samples $x_1$ to $x_N$ in accordance with the application-specific functions of the host device. The host device can also be configurable for different operating modes, analogous to those described for the configurable data converter system of FIG. 6A. The configurable host device can include up to N input data ports 710, where M input data ports are enabled to receive the multiplexed bit streams. A controller (not shown) would respond to user input to enable the M input data ports, power down the remaining input data ports and configure the demultiplexer 720 to invert the mapping of the multiplexer 610.

Figure 8A:
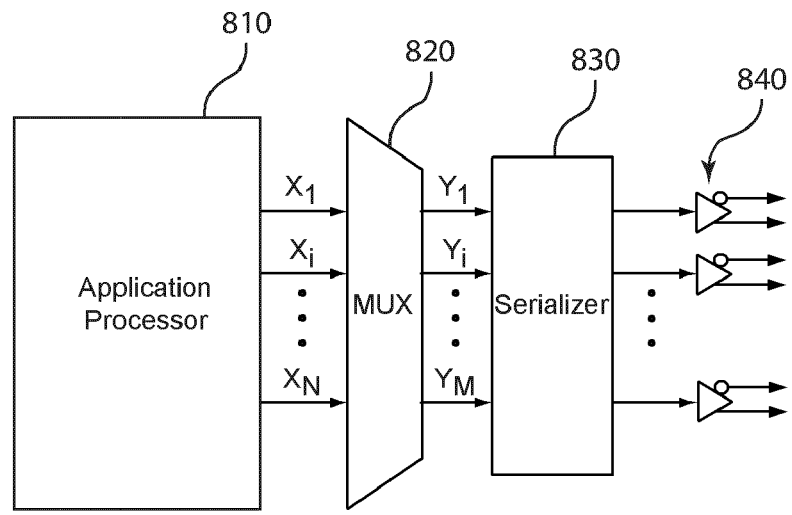
FIG. 8A is a block diagram of an application device that includes port concentration for efficient data transfer.
Figure 8B:
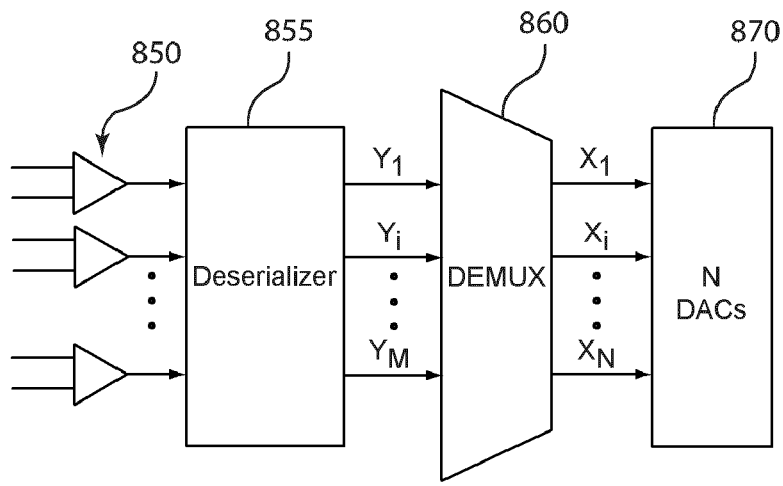
FIG. 8B is a block diagram of the digital to analog conversion device that includes port concentration.

Another embodiment of the present invention provides efficient transmission of digital signals from an application device to a digital to analog conversion device. FIG. 8A is a block diagram of an application device that includes port concentration for efficient data transfer. The application device includes an application processor 810 that generates N digital signals. The configurations for port concentration are analogous to those described above for the data converter system, except that signal samples, $x_1$ to $x_N$ correspond to one sample from each digital signal output from the application processor 810 instead of N ADCs 110. The signal samples have a sample rate and the signal samples $x_1$ to $x_N$ are parallel samples provided during one sample period. The multiplexer 820 and the serializer 830 provide multiplexed bit streams $y_1$ to $y_M$. A reduced number M of data ports 840 transmit the multiplexed bit streams $y_1$ to $y_M$ to the digital to analog converter device. The application device can also be configured for selectable operating modes, including normal, port concentration and serial modes, by incorporating a controller such as that described with respect to FIG. 6A. The application device also includes a data clock, frame clock, PLL and a sample clock instead of an ADC input clock, analogous to those described with respect to FIGS. 1A to 5A. The controller provides control parameters to set the frequencies for the clocks in accordance with the selected operating mode. FIG. 8B is a block diagram of the digital to analog conversion device. At the digital interface of the DAC device, M data ports 850 receive the bit streams and the deserializer 855 converts the received serial bits to parallel multiplexed bit streams $y_1$ to $y_M$. During each sample period, the demultiplexer 860 reorders the bits of the multiplexed bit streams $y_1$ to $y_M$ to reproduce the signal samples $x_1$ to $x_N$ of the N digital signals. The N DACs 870 convert the N digital signals to N analog signals (not shown). The DAC device can also be configurable for the port concentration modes, normal mode and serial mode. The configurable DAC device can include up to N input data ports 850, where M input data ports are enabled to receive the multiplexed bit streams. A controller (not shown) would respond to user input to enable the M input data ports, power down the remaining input data ports and configure the demultiplexer 860 to invert the mapping of the multiplexer 820.

The embodiments described above include multiplexers that reorder the bits of the output samples of the parallel ADCs. A typical multiplexer is a data selector having multiple inputs and an output. The multiplexer selects from among the data inputs based on one or more input control signals. Logic circuitry applied to the data inputs and the control signals selects a particular input to produce the output. Alternatives for the multiplexers shown in FIGS. 2A,B to 8A,B may have different configurations and connections with the parallel ADCs. Various orders of the reordered bits, shown in FIGS. 2B to 5B, may be used to produce the same number of output bit streams. A FIFO buffer can be coupled between the multiplexers and the serializers. The multiplexer outputs are written to the buffer at the ADC clock frequency and provided to the serializers at a rate compatible with the data clock frequency. The multiplexers and the timing of accesses to the FIFO buffers provide the reordered bits in the appropriate order to the serializers. In alternative embodiments, various devices may be used to reorder the bits output from the ADC to produce a reduced number of data streams.

An ADC system incorporating the present invention can be implemented in a single integrated circuit (IC) having N analog inputs and at least M LVDS data ports. The IC includes N independent ADCs for converting N input analog signals to N digital signals in parallel. The ADCs can be implemented by pipeline data converters comprising multiple stages of flash converters, although the present invention is applicable to other ADC architectures. The resulting signal samples are passed to digital logic implementing the multiplexers and serializers for reordering the bits of the signal samples. The M multiplexed bit streams are provided to the LVDS pairs for low pin count, low noise interface to the host processor. For operating in a single mode, the number of active data ports is a fixed value of M (where M>1) based on system specifications. For configurable operation in more than one mode, such as described with respect to FIGS. 6A and 6B, the ADC system includes up to N data ports. Input for the controller 640 can be implemented using I/O pins designated for control parameter input and/or a configuration register. Serial peripheral interface (SPI) pins can provide the control parameters to the control register. For the host device described with respect to FIG. 7, the data ports 710 and demultiplexer 720 are integrated with the device, reducing the number of required data ports from N to M. A configurable host device would also include the controller to support multiple port concentration modes.

For the application device, such as described with respect to FIG. 8A, the multiplexer, serializer and controller are integrated within the device for transferring samples of the N digital signals over M data ports of the device. The DAC system described with respect to FIG. 8B can be implemented in a single IC that includes N DACs 870 for converting N digital signals to N analog signals, at least M data ports 850 for receiving multiplexed bit streams and a demultiplexer 860 for converting the M multiplexed bit streams to N signal samples of N digital signals per sample period. The implementation of a configurable DAC device also includes the controller (not shown in FIG. 8B) within the device to support the different port concentration modes.

The embodiments described above include LVDS data ports. Other data ports and transmission protocols can be used for transfer of the multiplexed bit streams. Alternative embodiments can include 8b/10b SerDes or other encoding/decoding. For example, the buffering and control logic required for 8b/10b encoding can be added to the serializers on the transmit side and 8b/10b decoding can be added to the deserializers on the receive side.

The components described for these embodiments are meant to be exemplary only and are not intended to limit the invention to any specific set of components or configurations. In various embodiments, one or more of the components described may be omitted, combined, modified, or additional components may be included.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

I claim:

1. A method of transferring signal samples over a digital interface of a data converter implemented in a single integrated circuit including N analog to digital converters (ADCs), N analog inputs at an analog interface for receiving N analog signals, where N is greater than one, and a plurality of data ports at the digital interface, the method comprising:

digitally sampling the N analog signals received at the analog interface of the integrated circuit, wherein the N ADCs respond to an input clock to form N signal samples per sample period, the input clock having an input clock frequency, wherein each ADC produces one signal sample per sample period in accordance with the input clock frequency, the signal sample represented by a number of bits per sample;

mapping the bits of the N signal samples for each sample period to M subsets of bits to form M multiplexed data sets, where M is greater than one and less than N, wherein each multiplexed data set consists of a number K of multiplexed bits equal to the number of bits per sample multiplied by N then divided by M;

generating a data clock having a data clock frequency substantially equal to the input clock frequency multiplied by the number K;

serializing the multiplexed bits of the M multiplexed data sets in response to the data clock to provide the K multiplexed bits of a corresponding multiplexed data set sequentially at the data clock frequency to a corresponding data port of the plurality of data ports; and transmitting the M multiplexed data sets in parallel over M of the data ports of the integrated circuit, wherein the corresponding data port transmits the K multiplexed bits of the corresponding multiplexed data set at a data transfer rate that depends on the data clock frequency.

2. The method of claim 1, wherein the plurality of data ports at the digital interface consists of M data ports, wherein each data port is used for the step of transmitting.

3. The method of claim 1, the plurality of data ports includes more than M data ports, the method further comprising:

enabling the number M of the plurality of data ports, wherein remaining data ports in the plurality of data ports are powered down.

4. The method of claim 1, wherein the data ports in the plurality of data ports comprise low voltage differential signaling (LVDS) ports, wherein the step of transmitting transfers the multiplexed data sets over M LVDS ports.

5. The method of claim 1, further comprising:

receiving the M multiplexed data sets in parallel at M input data ports of a destination device; and demapping the multiplexed bits of the M multiplexed data sets to reproduce the N signal samples at the destination device.

6. A multiple analog to digital converter (ADC) apparatus, implemented in a single integrated circuit including N analog inputs that receive N analog signals at an analog interface, where N is greater than one, and a plurality of data ports at a digital interface, the apparatus comprising:

N ADCs that digitally sample the N analog signals received at the analog interface of the integrated circuit, wherein the N ADCs produce N signal samples per sample period in response to an input clock, the input clock having an input clock frequency, wherein each ADC produces one signal sample per sample period in accordance with the input clock frequency, the signal sample represented by a number of bits per sample;

one or more multiplexers, each multiplexer receiving signal samples from at least two ADCs and each ADC providing signal samples to one of the multiplexers, wherein the one or more multiplexers map the bits of the N signal samples for each sample period to M subsets of bits to form M multiplexed data sets in accordance with a predetermined mapping, where M is greater than one and less than N, wherein each multiplexed data set consists of a number K of multiplexed bits equal to the number of bits per sample multiplied by N then divided by M;

a data clock having a data clock frequency substantially equal to the input clock frequency multiplied by the number K, the data clock distributed to a plurality of serializers; and the plurality of serializers receiving the M multiplexed data sets from the one or more multiplexers and providing the M multiplexed data sets to M of the data ports, wherein a corresponding serializer receives a corresponding multiplexed data set and responds to the data clock to provide the K multiplexed bits sequentially at the data clock frequency to a corresponding data port, the corresponding data port transmitting the K multiplexed bits of the corresponding multiplexed data set at a data transfer rate that depends on the data clock frequency, wherein the M data ports transmit the multiplexed data sets in parallel from the integrated circuit.

7. The apparatus of claim 6, wherein the plurality of data ports at the digital interface consists of M data ports.

8. The apparatus of claim 6, wherein the plurality of data ports at the digital interface includes more than M data ports, the apparatus further comprising:

a controller coupled to the plurality of data ports, wherein the controller enables M of the plurality of data ports, wherein remaining data ports are powered down.

9. The apparatus of claim 6, wherein the plurality of data ports at the digital interface includes more than M data ports, and the apparatus further comprising:

a controller and a user input for receiving control parameters from a user, wherein the controller responds to the user input to select an operational mode from a plurality of selectable operational modes, to enable M of the plurality of data ports and to power down remaining data ports, in accordance with the control parameters.

10. The apparatus of claim 6, wherein the plurality of data ports are coupled to M input data ports of a destination device, the M input data ports receiving the M multiplexed data sets in parallel.

* * * * *